US006423615B1

(12) United States Patent
Ravi et al.

(10) Patent No.: US 6,423,615 B1
(45) Date of Patent: Jul. 23, 2002

(54) SILICON WAFERS FOR CMOS AND OTHER INTEGRATED CIRCUITS

(75) Inventors: Kramadhati V. Ravi, Atherton; Li Ling, Fremont; Sing-Chung S. Hu, San Jose, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/401,555

(22) Filed: Sep. 22, 1999

(51) Int. Cl.[7] .......................... H01L 21/46; H01L 21/30
(52) U.S. Cl. ................. 438/458; 438/231; 148/DIG. 41
(58) Field of Search ................... 438/458, 231; 148/DIG. 41, DIG. 34, DIG. 33

(56) References Cited

U.S. PATENT DOCUMENTS 5,183,777 A * 2/1993 Doki et al. .......... 148/DIG. 34

| 5,770,504 A | 6/1998 | Brown et al. |
| 5,897,705 A | 4/1999 | Siebert et al. |

OTHER PUBLICATIONS

Stanley Wolf Silicon Processing for the VSLI Era vol! Lattice Press 1986 pp. xxiii, 8–9, 12–14,23–25,27.*
Suzuki et al., "Boron Out Diffusion From Si Substrates In Various Ambients", Sold–State Electronics, vol. 41, No. 8, Aug. 1997, pp. 1095–1097.
Matsushita, Y., "Hydrogen Annealed Silicon Wafer: Hi Wafer", Silicon Wafer Symposium, SEMI 1998, R1–R3.

* cited by examiner

Primary Examiner—Olik Chaudhuri
Assistant Examiner—David S Blum
(74) Attorney, Agent, or Firm—Fish & Richardson P.C.

(57) ABSTRACT

Techniques include heating a substantially uniformly boron-doped wafer to achieve a significantly increased resistivity in a near-surface region of the water and forming at least one electrical circuit element in the near-surface region.

27 Claims, 6 Drawing Sheets

SILICON WAFERS FOR CMOS AND OTHER INTEGRATED CIRCUITS

BACKGROUND

The present invention relates generally to silicon wafers for complementary metal-oxide-semiconductor (CMOS) and other integrated circuits.

As integrated semiconductor devices continue to grow in complexity, there is a continuing need to increase the density of the semiconductor devices. However, the increase in density can cause various problems some of which can lead to device failure. One such problem is "latch-up", which can be caused by the close proximity of n-channel and p-channel transistors in CMOS integrated circuits. For example, a typical CMOS integrated circuit fabricated on a p-type substrate has a p-channel transistor fabricated in an n-well and an n-channel transistor fabricated in a p-well with only a short distance separating the wells. Such a structure inherently forms a parasitic lateral bipolar n-p-n structure and a parasitic vertical p-n-p bipolar structure. Under certain biasing conditions, the p-n-p structure can supply base current to the n-p-n structure, or vice-versa, causing a current to flow from one well to the other well. The large current can damage the integrated circuit.

One technique for reducing the incidence of latch-up is to fabricate the CMOS transistors on an epitaxial silicon wafer 10 that includes, for example, a lightly boron-doped epitaxial layer 12 deposited on a heavily boron-doped substrate 14 (FIG. 1A). Electrical circuit elements 16, 18 are fabricated in the top epitaxial layer 12 as shown, for example, in FIG. 1B. The heavily doped substrate 14 helps prevent device failure that can result from latch-up and functions as a region into which metallic impurities are trapped.

Unfortunately, these epitaxial silicon wafers can be relatively expensive. A substantial portion of the cost of manufacturing such wafers is a result of formation of the lightly-doped epitaxial layer. Increased manufacturing costs also can result from the high cost of equipment used to fabricate the epitaxial layer, the relatively low throughput associated with the formation of the epitaxial layer, and the complexity of quality control. Accordingly, it would be advantageous to reduce the manufacturing costs associated with boron-doped silicon wafers without adversely impacting circuit performance.

SUMMARY

In general, techniques include heating a substantially uniformly boron-doped wafer to achieve a significantly increased resistivity in a near-surface region of the wafer and forming at least one electrical circuit element in the near-surface region. Various features and advantages will be readily apparent from the following detailed description, the accompanying drawings and the claims.

DETAILED DESCRIPTION

Figure 2:
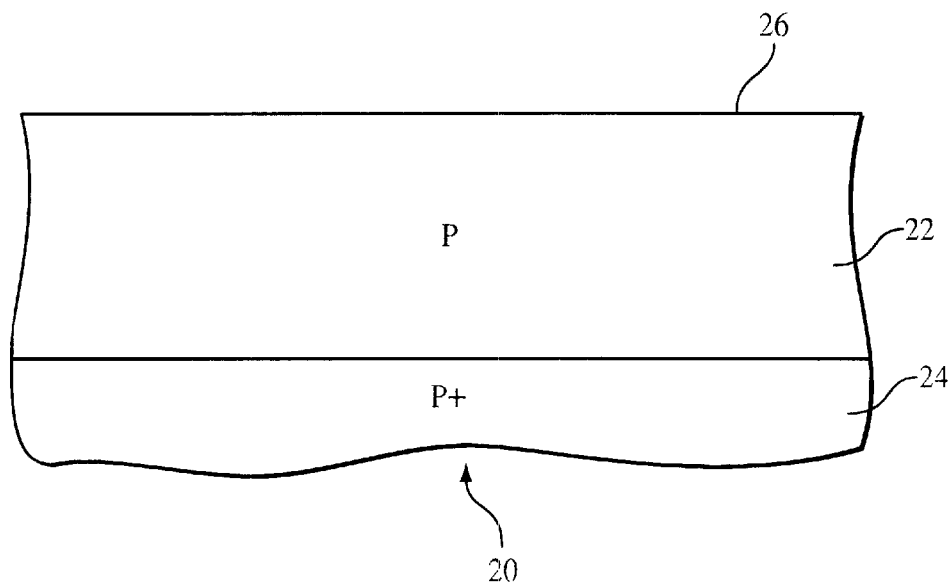
FIG. 2 illustrates a silicon wafer according to the invention.

FIG. 2 shows a boron-doped silicon wafer 20 which is suitable for the fabrication of CMOS and other integrated circuits. The wafer 20 has a near-surface region 22 having a significantly reduced amount of boron. The near-surface reduced boron concentration region 22 extends along substantially the entire polished upper surface 26 of the wafer 20. The concentration of boron atoms in the near-surface region 22 is typically greater than zero, but significantly less than the concentration of boron atoms in the bulk region 24, which has a substantially uniform level of boron doping.

Figure 3:
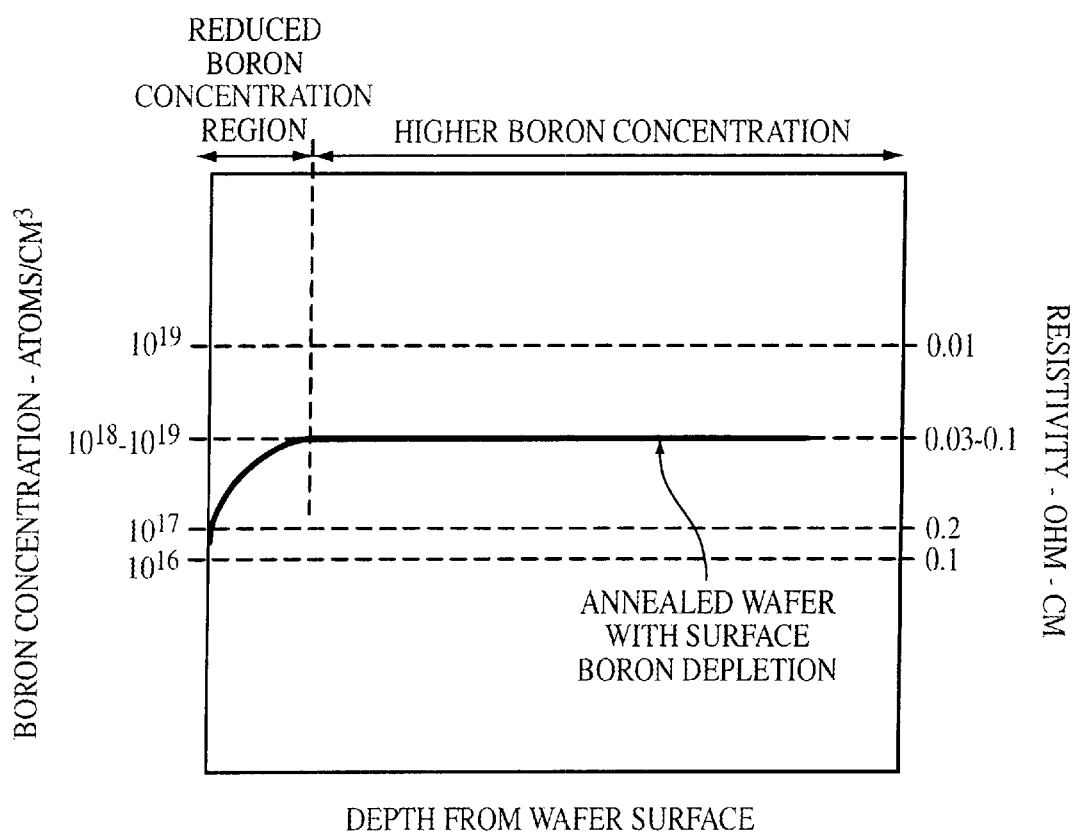
FIG. 3 is a graph illustrating an exemplary profile of boron concentration in the wafer of FIG. 2 as a function of depth.

FIG. 3 illustrates an exemplary profile of boron concentration and resistivity in the silicon wafer 20 as a function of distance from the polished surface 26 of the wafer. In general, the near-surface region 22 exhibits a boron concentration gradient that increases with increasing depth, whereas the concentration of boron atoms in the bulk region 24 of the wafer 20 is substantially uniform. As the concentration of boron atoms decreases near the wafer surface 26, the resistivity increases. Therefore, the resistivity of the wafer 20 in the near-surface reduced boron concentration region 22 is greater than the resistivity in the bulk region 24.

Figure 4:
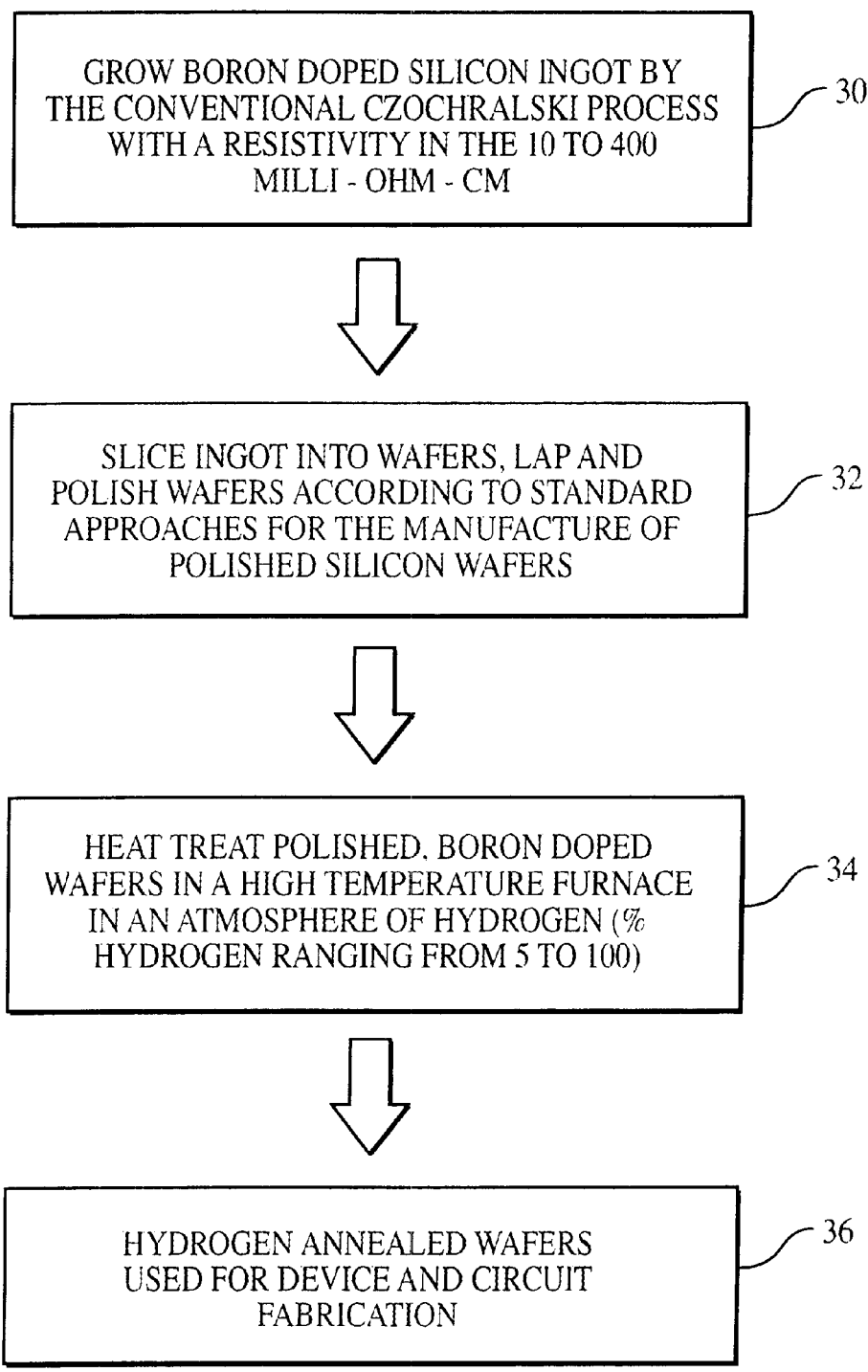
FIG. 4 is a flow chart showing steps in an exemplary process for fabricating a wafer according to the invention.

FIG. 4 illustrates a process by which a wafer 20 having a near-surface reduced boron concentration region 22 can be fabricated. First, a high quality, single crystal, homogeneously boron-doped silicon ingot is formed (step 30). Preferably, the doping level of boron results in a resistivity in the range of about 10 to 1,000 milli-ohm-centimeter (mohm-cm). In some applications, it is advantageous to provide the ingot with a boron-doped level so that the resistivity is in a range of about 100 to 400 mohm-cm. Resistivities in the range of about 30 to 70 mohmcm-also may be particularly suitable for some applications.

A conventional Czochralski technique can be used to form the uniformly boron-doped silicon ingot, although in some implementations, other processes, such as crucible-free floating or float zones techniques, can be used. The ingot then is sliced into individual wafers which are subsequently lapped and polished (step 32). Standard techniques can be used for the slicing, lapping and polishing.

The polished wafers are subjected to a heat treatment in a high temperature furnace to cause at least some of the boron atoms to diffuse out of the near-surface region 22 (step 34). In exemplary heat treatments, the polished wafers are heated at temperatures in the range of about 1,000 celsius (°C.) to about 1,250° C. The heat treatment can be performed, for example, in an atmosphere containing hydrogen for a duration of about 1 to about 5 hours. The amount of hydrogen gas in the furnace can vary from as little as about 5% to as much as 100%. The hydrogen gas is an active gas that reacts with the boron atoms in the wafer 20. If less than about 100% hydrogen gas is used, a mixture of hydrogen gas and a neutral gas, such as argon, can be used. Boron that diffuses out of the wafer 10 can combine with the hydrogen to form a gaseous byproduct which is swept out of the furnace.

The annealed wafers can then be used for device and circuit fabrication (step 36).

Figure 5:
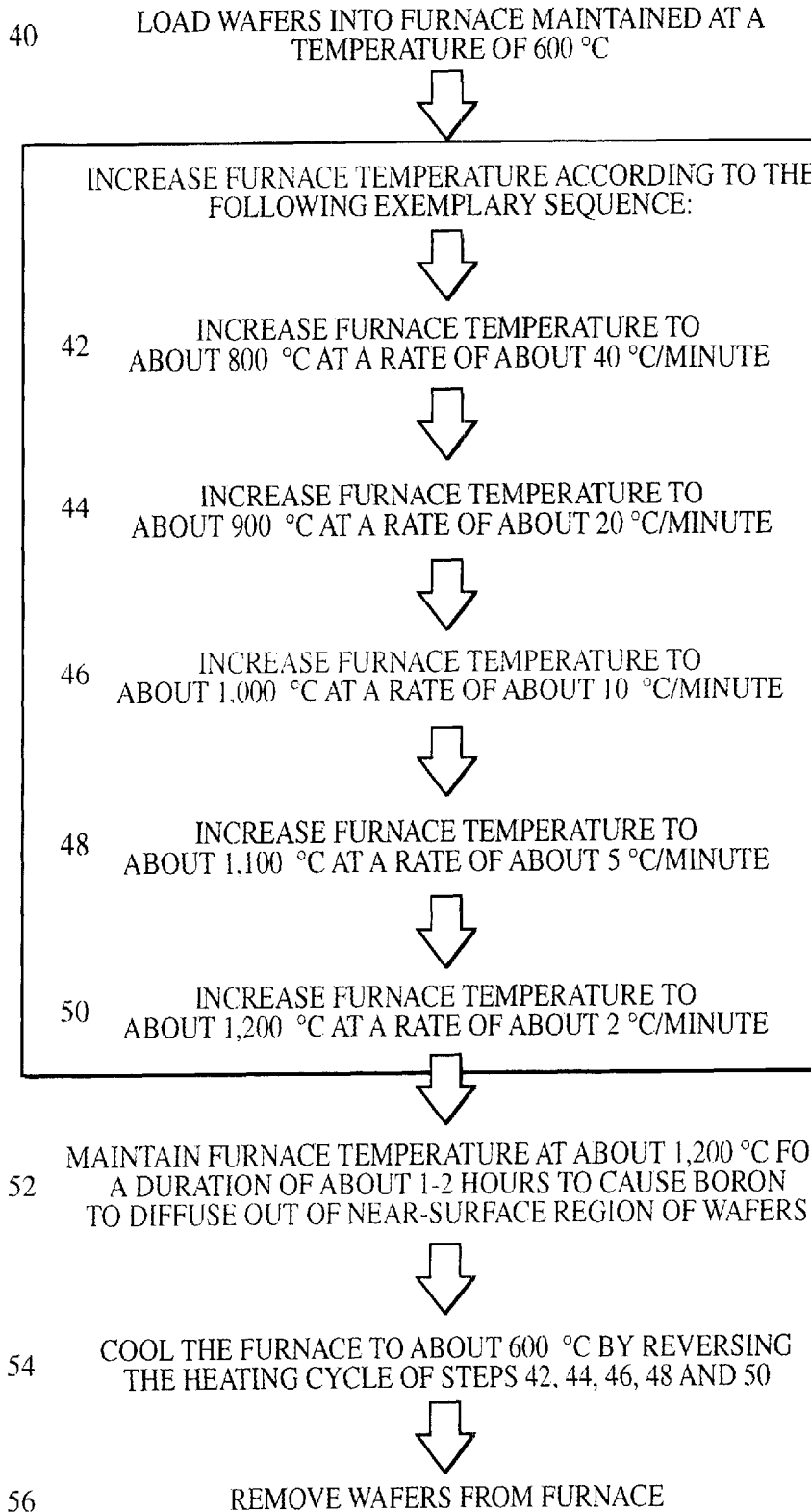
FIG. 5 illustrates further details of a wafer heat treatment according to one specific implementation of the invention.

FIG. 5 illustrates further details of the heat treatment according to one specific implementation. A batch of about 100 to 150 polished wafers are loaded into a vertical diffusion furnace maintained at a temperature of about 600° C. (step 40). The furnace temperature is gradually increased. First, the furnace temperature is increased to about 800° C. at a rate of approximately 40 ° C./minute (step 42). Next, the furnace temperature is increased from 800° C. to about 900° C. at a rate of approximately 20° C./minute (step 44). The furnace temperature is then increased to about 1,000° C. at a rate of approximately 10° C./minute (step 46). Subsequently, the furnace temperature is increased to about 1,100° C. at a rate of approximately 5° C./minute (step 48). The furnace temperature is then increased to a temperature of about 1,200° C. at a rate of approximately 2° C./minute (step 50). The foregoing sequence, in which the furnace is heated at a decelerated rate, requires about ninety minutes to heat the furnace.

Once the furnace is heated to 1,200° C., the temperature of the furnace is maintained at that temperature for a duration of 1–4 hours to cause boron to diffuse out of the near-surface region of the wafers (step 52).

Following the heat treatment, the furnace is cooled to about 600° C. by reversing the heating cycle described above in steps 42, 44, 46, 48 and 50 (step 54). In other words, the cooling rate is accelerated as the furnace temperature approaches 600° C. Once the furnace temperature reaches about 600° C., the wafers can be removed from the furnace (step 56).

The ramped heating sequence described above can help prevent deformation or warping of the wafers, which can result if the furnace is heated too quickly. However, other temperatures and temperature sequences can be used to cause a substantial amount of boron to diffuse out of the near-surface region of the wafers. For example, in some cases, the furnace temperature may be increased at a substantially constant rate, or the furnace may be cooled at a substantially constant rate. In general, the furnace need not be cooled using the reverse sequence used to raise the furnace temperature. In many applications, the furnace can be cooled at a more rapid rate than the rate at which the furnace is heated. Other types of furnaces may be used for performing the heat treatment.

Figure 6:
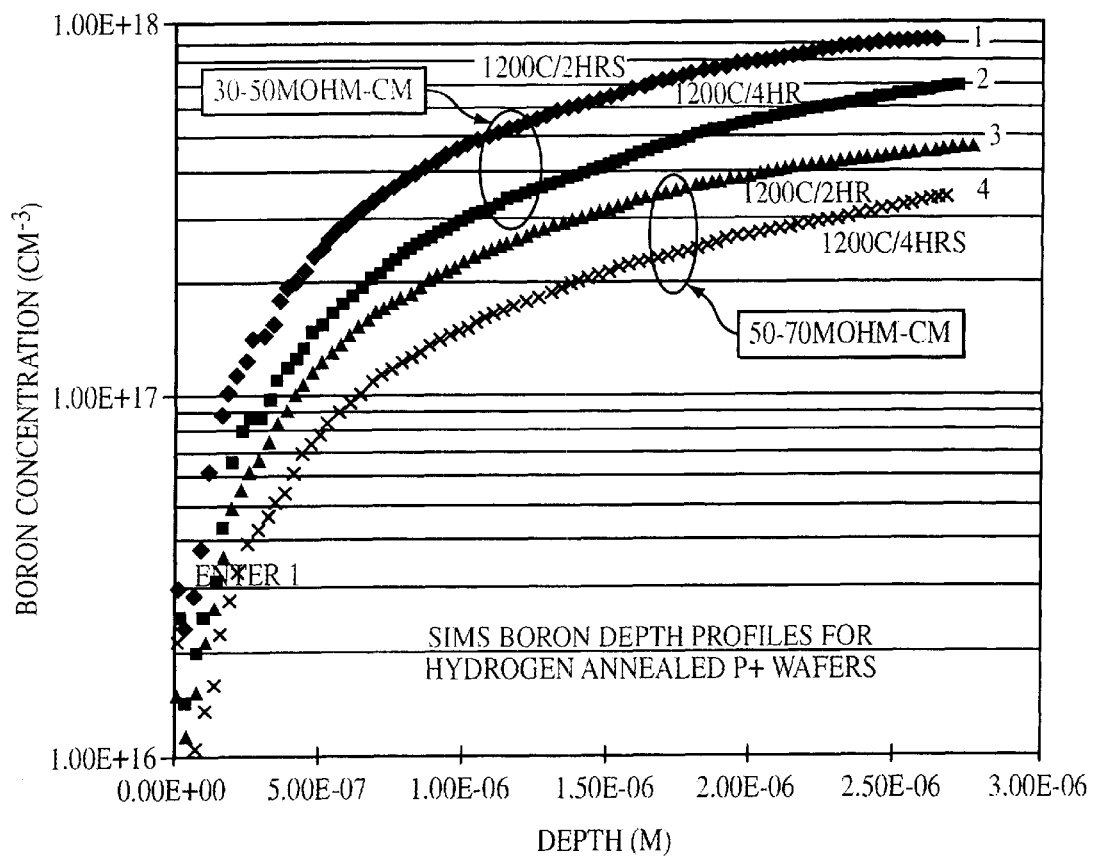
FIG. 6 is a graph showing boron concentration in several silicon wafers according to the invention.

FIG. 6 is a graph showing boron concentration in several silicon wafers as a function of depth from the wafer surface. One pair of wafers was prepared from a silicon ingot having a boron concentration that resulted in a resistivity in the range of about 30–50 mohm-cm. One of the two wafers was annealed at a temperature of about 1,200° C. for approximately two hours. The second of the two wafers was annealed at 1,200° C. for about four hours. A second pair of wafers was prepared from a silicon ingot having a boron concentration that resulted in a resistivity in the range of about 50–70 mohm-cm. One of the two wafers was annealed at a temperature of about 1,200° C. for approximately two hours, whereas the second wafer was annealed at 1,200° C. for about four hours. Each of the wafers was annealed in an atmosphere of about 100% hydrogen.

The boron concentration data in FIG. 6 was obtained through secondary ion mass spectroscopy (SIMS) analysis. As can be seen from the graph in FIG. 6, the wafers exhibit a boron concentration gradient in which the boron concentration is significantly less in the near-surface region compared to the boron concentration in the bulk of the wafer. Therefore, the resistivities near the surface of the wafers are higher than in the bulk regions of the wafers.

In general, it is desirable to use a wafer obtained from an ingot having a boron concentration level such that, following the wafer heat treatment, the near-surface region of the wafer has a resistivity in the range of about 0.5 to 10 ohm-centimeter (ohm-cm). The heat treatment can result in a near-surface region of the wafer having a boron concentration about an order of magnitude less than the boron concentration in the bulk of the wafer. Generally, the boron gradient increases with increasing depth from the surface to a depth in the range of about 0.1 to 1.0 μm. For applications such as the fabrication of CMOS integrated circuits, the depth of the near-surface reduced boron concentration region should be on the order of about at least 0.2 μm.

Figure 7:
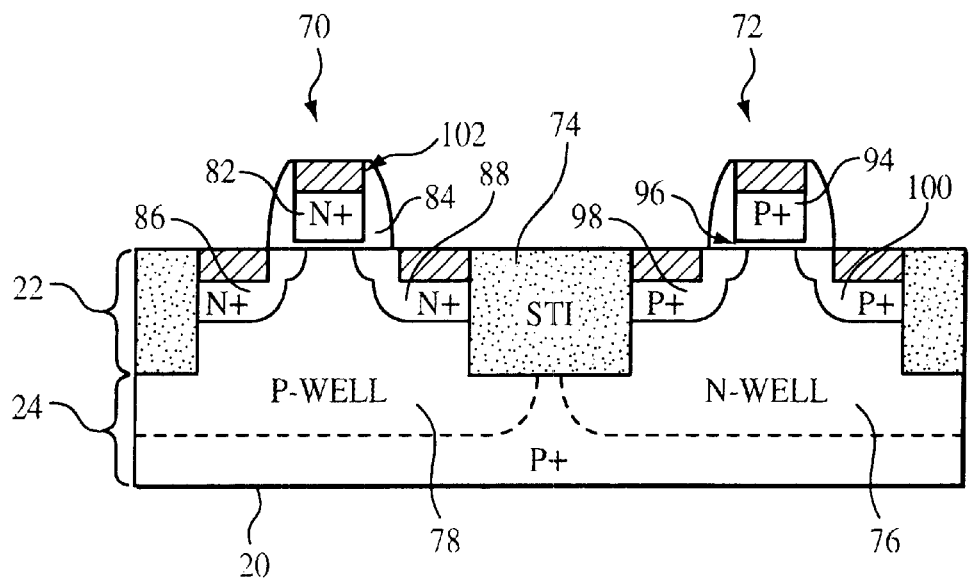
FIGS. 7 and 8 show cross-sections of parts of exemplary CMOS integrated circuits formed in wafers according to the invention.

A wafer 20 fabricated according to the technique described above is suitable for the fabrication of integrated circuits that can benefit from a structure in which electrical circuit elements are formed in the near-surface reduced boron concentration region 22. As shown in FIG. 7, circuit elements such an n-channel MOS transistor 70 and a p-channel MOS transistor 72 can be formed in the near-surface region 22 using standard fabrication techniques. The n-channel transistor 70, which includes a gate 82, a gate dielectric 84 and doped regions 86, 88, is formed in a p-type well 78. An n-type well region 76 is provided for the p-channel transistor which includes a gate 94, a gate dielectric 96 and doped regions 98, 100. The NMOS and PMOS transistors 70, 72 are separated by a shallow trench isolation region 74. Metallization or other conductive contacts 102 are provided for the N+ and P+ gates and the doped regions. The devices 70, 72 are exemplary only and other devices also can be formed on the wafer 20.

Figure 1A:
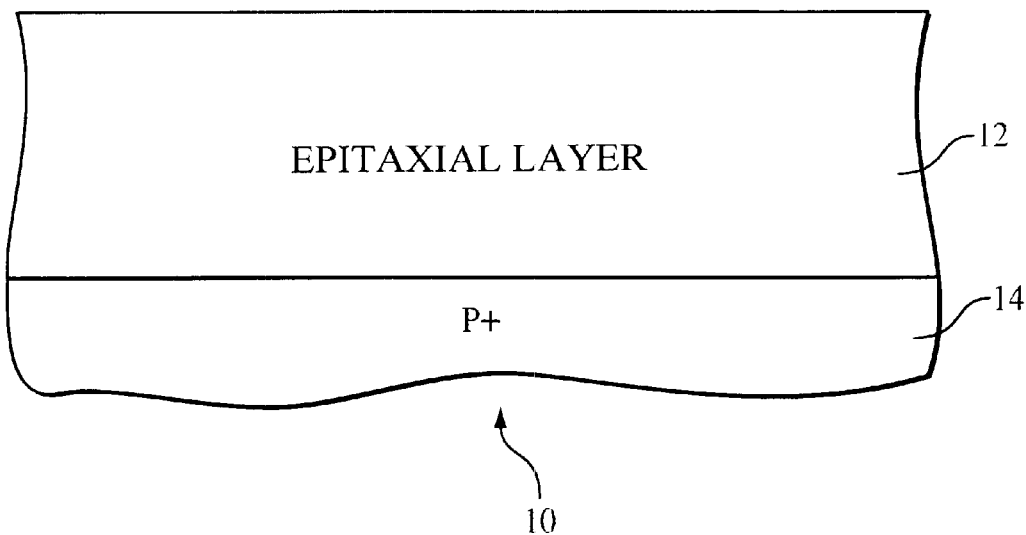
FIG. 1A illustrates an epitaxial semiconductor wafer.
Figure 1B:
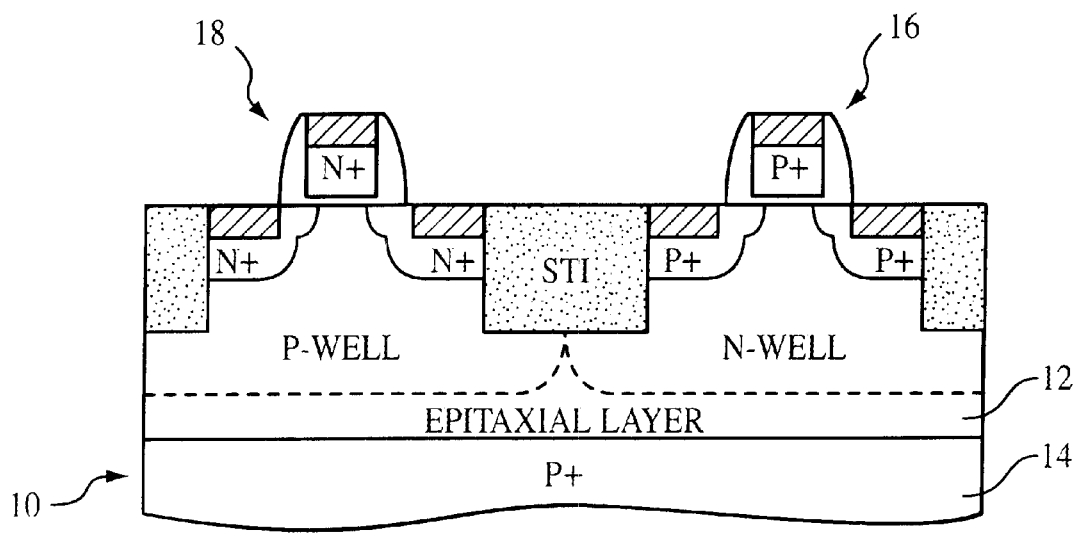
FIG. 1B illustrates part of a CMOS integrated circuit fabricated on the epitaxial semiconductor wafer of FIG. 1A.

Several advantages can be obtained by fabricating the CMOS integrated circuit in the wafer 20 (FIG. 7) rather than the epitaxial wafer 10 (FIG. 1B). As previously mentioned, the overall cost of fabrication can be reduced by eliminating the need to form an epitaxial layer on the semiconductor wafer. The reduction in manufacturing costs can be particularly significant with respect to large wafers, for example, 300 millimeter (mm) wafers.

Fabricating devices on a wafer 20 can still provide some of the advantages of an epitaxial wafer. For example, the lighter doping of the near-surface reduced boron concentration region 22 enables circuit fabrication while the heavier doping of the bulk region 24 of the wafer can help prevent the occurrence of latch-up.

In addition, the heat treatment can cause oxygen to diffuse out of the near-surface region and can cause the precipitation of oxygen particles in the bulk region of the wafer. Precipitation of oxygen in the bulk region helps trap metal impurities in the wafer. In addition, the heat treatment can result in wafers having fewer point defects in the near-surface region. Trapping metal impurities in the silicon wafers and reducing the number of defects prior to device fabrication is increasingly important because of the relatively high temperatures required to achieve those features. Assuming that the current trend toward the use of lower temperatures for device fabrication continues, the ability to trap metal impurities and reduce the number of defects prior to device fabrication may obviate the need to perform subsequent high temperature processes during device fabrication.

Figure 8:
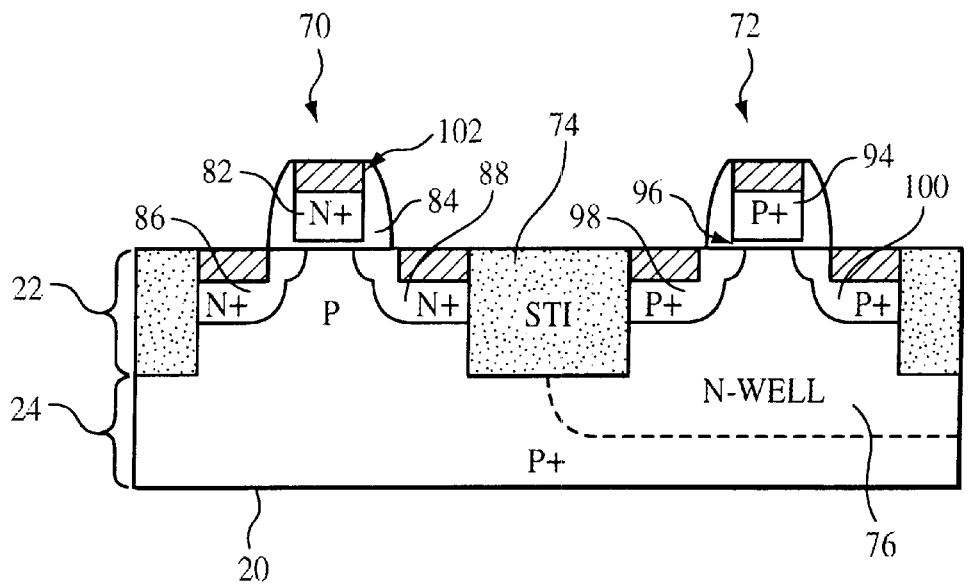

In some applications it is possible to eliminate the step of forming a p-type well 78 in the near-surface reduced boron concentration region 22 during fabrication of the NMOS transistor 70 in the wafer 20 (see FIG. 8). That is because the near-surface region 22 remains lightly doped with boron atoms even after the heat treatment. As a result, at least one implant step can be eliminated in some implementations during CMOS integrated circuit fabrication.

Other implementations are within the scope of the following claims.

What is claimed is:

1. A method of manufacturing a semiconductor wafer, the method comprising:

growing a silicon ingot substantially uniformly doped with boron, wherein the ingot has a resistivity in a range of about 10 to 1,000 milli-ohm-centimeter;

slicing the ingot into individual wafers;

heating at least one of the wafers in an atmosphere containing hydrogen at a temperature of at least about 1,000° C. to achieve a significantly increased resistivity in a near-surface region of the at least one of the wafers; and fabricating one or more electrical circuit elements in the near-surface region after the heating.

2. The method of claim 1 wherein the at least one of the wafers is heated to achieve a resistivity in the near-surface region in a range of about 0.5 to 10 ohm-centimeter.

3. The method of claim 2 wherein the near-surface region with the significantly increased resistivity has a thickness of at least 0.2 micron.

4. The method of claim 3 wherein the at least one of the wafers is heated at a temperature of approximately 1,200° C. during heating.

5. The method of claim 3 wherein heating the at least one of the wafers takes place in an atmosphere having at least about 5% hydrogen.

6. The method of claim 3 wherein the heating is performed in an atmosphere consisting essentially of a neutral gas and at least about 5% hydrogen.

7. The method of claim 1 wherein the heating includes raising an ambient temperature from an initial temperature to the temperature of at least about 1,000° C. in a plurality of stages in which the rate at which the temperature is increased during each stage is less than the rate at which the temperature is increased during a previous stage.

8. The method of claim 1 wherein the at least one of the wafers is heated at a temperature of at least 1,000° C. for at least about one hour.

9. The method of claim 1 wherein the ingot has a resistivity in a range of about 30 to 70 milli-ohm-centimeter, and wherein the at least one of the wafers is heated at a temperature of at least about 1,000° C. for at least about two hours.

10. The method of claim 1 wherein the ingot has a resistivity in a range of about 30 to 70 milli-ohm-centimeter, and wherein the at least one of the wafers is heated at a temperature of at least about 1,000° C. to achieve a resistivity in a near-surface region of the wafer in a range of about 0.5 to 10 ohm-centimeter.

11. The method of claim 1 wherein the ingot has a resistivity in a range of about 100 to 400 milli-ohm-centimeter, and wherein the at least one of the wafers is heated at a temperature of at least about 1,000° C. to achieve a resistivity in a near-surface region of the wafer in a range of about 0.5 to 10 ohm-centimeter.

12. The method of claim 10 further including fabricating one or more electrical circuit elements in the near-surface region after the heating.

13. A method of manufacturing a semiconductor integrated circuit, the method comprising:

heating a substantially uniformly boron-doped wafer in an atmosphere containing hydrogen at a temperature of at least about 1,000° C. to achieve a significantly increased resistivity in a near-surface region of the at least one wafer, wherein prior to the heating, the wafer has a resistivity in a range of about 10 to 1,000 milli-ohm-centimeter; and fabricating at least one electrical circuit element in the near-surface region.

14. The method of claim 13 wherein, after the heating, the near-surface region has at resistivity in a range of about 0.5 to 10 milli-ohm-centimeter.

15. The method of claim 14 wherein after the heating, the resistivity of a bulk region of the wafer is significantly less than the resistivity in the near-surface region.

16. The method of claim 14 wherein the near-surface region has a thickness of at least about 0.2 micron, and wherein the fabricating includes forming a CMOS integrated circuit in the near-surface region.

17. The method of claim 14 including fabricating an n-channel MOS device in the near-surface region without performing a p-well implant for the n-channel MOS device.

18. The method of claim 14 wherein, prior to the heating, the wafer has a resistivity in a range of about 30 to 70 milli-ohm-centimeter.

19. The method of claim 14 wherein, prior to the heating, the wafer has a resistivity in a range of about 100 to 400 milli-ohm-centimeter.

20. The method of claim 14 wherein the heating includes heating the wafer at a temperature of at least 1,200° C. for at least about two hours.

21. The method of claim 14 wherein the heating is performed in an atmosphere containing at least about 5% hydrogen.

22. The method of claim 14 wherein the heating is performed in an atmosphere consists essentially of a neutral gas and at least about 5% hydrogen.

23. A method comprising:

heating a substantially uniformly boron-doped wafer to achieve a significantly increased resistivity in a near-surface region of the wafer; and subsequently forming at least one electrical circuit element in the near-surface region.

24. The method of claim 23 including forming an n-channel transistor in the near-surface region.

25. The method of claim 23 including forming a p-channel transistor in the near-surface region.

26. The method of claim 23 wherein the heating results in a near-surface region having a boron concentration at least an order of magnitude less than a boron concentration in a bulk area of the wafer, the near-surface region having a depth of at least 0.2 micron.

27. The method of claim 23 wherein the heating is performed in an atmosphere containing hydrogen.

* * * * *